(12) United States Patent
Ma et al.

(10) Patent No.: US 10,991,663 B2
(45) Date of Patent: Apr. 27, 2021

(54) SEMICONDUCTOR DEVICE INCLUDING DUMMY CONDUCTIVE CELLS

(71) Applicant: TAIWAN SEMICONDUCTOR MANUFACTURING CO., LTD., Hsinchu (TW)

(72) Inventors: Wei-Yu Ma, Taitung (TW); Hui-Mei Chou, Hsinchu County (TW); Kuo-Ji Chen, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/714,542

(22) Filed: Dec. 13, 2019

(65) Prior Publication Data

US 2020/0118948 A1 Apr. 16, 2020

Related U.S. Application Data

(62) Division of application No. 16/046,449, filed on Jul. 26, 2018, now Pat. No. 10,510,692, which is a division of application No. 14/062,845, filed on Oct. 24, 2013, now Pat. No. 10,043,767.

(51) Int. Cl.
| | |
|---|---|
| H01L 21/4763 | (2006.01) |
| H01L 23/58 | (2006.01) |
| H01L 23/528 | (2006.01) |
| H01L 23/522 | (2006.01) |
| H01L 27/02 | (2006.01) |

(52) U.S. Cl.
CPC .......... *H01L 23/585* (2013.01); *H01L 23/522* (2013.01); *H01L 23/5286* (2013.01); *H01L 27/0207* (2013.01); *H01L 2924/0002* (2013.01)

(58) Field of Classification Search
CPC .. H01L 23/522; H01L 23/585; H01L 27/0207
USPC ........ 438/622, 926; 257/210, 211, 260, 261, 257/691, 758
See application file for complete search history.

(56) References Cited

U.S. PATENT DOCUMENTS

| | | | |
|---|---|---|---|
| 6,305,000 B1 * | 10/2001 | Phan ...................... | G06F 30/39 |
| | | | 716/120 |
| 6,785,877 B1 * | 8/2004 | Kozai ............... | H01L 27/11807 |
| | | | 716/127 |
| 7,470,630 B1 | 12/2008 | Chen et al. | |
| 7,574,685 B1 | 8/2009 | Dong et al. | |
| 9,299,450 B1 | 3/2016 | Pang et al. | |
| 10,297,330 B2 | 5/2019 | Zhang et al. | |

(Continued)

*Primary Examiner* — S. V. Clark
(74) *Attorney, Agent, or Firm* — Maschoff Brennan

(57) ABSTRACT

A method is disclosed and includes forming a plurality of dummy conductive cells that provides different densities in empty areas in metal layers of a semiconductor device according to overlap conditions of the empty areas each arranged between a pair of neighboring metal layers of metal layers. Forming the plurality of dummy conductive cells includes operations of forming a group of dummy conductive cells in a single empty area of the empty areas when the single empty area in one pair of the neighboring metal layers is overlapped by a signal line in the same pair of the neighboring metal layers. When viewed in plan view, projection areas of the group of dummy conductive cells are vertically overlapped by a projection area of the signal line. A semiconductor device is also disclosed herein.

20 Claims, 5 Drawing Sheets

(56) References Cited

U.S. PATENT DOCUMENTS

| | | |
|---|---|---|
| 10,381,339 B1 | 8/2019 | Wang et al. |
| 2002/0063335 A1 | 5/2002 | Ozawa et al. |
| 2002/0093849 A1 | 7/2002 | Hidaka |
| 2004/0088669 A1 | 5/2004 | Loh et al. |
| 2005/0110146 A1 | 5/2005 | Wang |
| 2006/0166434 A1 | 7/2006 | Kinoshita et al. |
| 2007/0222077 A1 | 9/2007 | Ogihara et al. |
| 2007/0272949 A1 | 11/2007 | Shinomiya et al. |
| 2009/0031261 A1* | 1/2009 | Smith ............... G06F 30/39 716/132 |
| 2009/0055792 A1 | 2/2009 | Itagaki |
| 2009/0205850 A1* | 8/2009 | Chow ............... H01L 23/48 174/126.1 |
| 2019/0074272 A1* | 3/2019 | Chu ............... H01L 21/82343 |
| 2019/0189632 A1 | 6/2019 | Lee et al. |

\* cited by examiner

SEMICONDUCTOR DEVICE INCLUDING DUMMY CONDUCTIVE CELLS

RELATED APPLICATIONS

The present application is a division of the U.S. application Ser. No. 16/046,449, filed Jul. 26, 2018, issued as U.S. Pat. No. 10,510,692 on Dec. 17, 2019, which is a division of the U.S. application Ser. No. 14/062,845, filed Oct. 24, 2013, issued as U.S. Pat. No. 10,043,767 on Aug. 7, 2018, all of which are herein incorporated by reference.

BACKGROUND

In semiconductor chips having low power and high performance, there are more and more power domains. If noise immunity in power lines and ground lines is not good enough, the integral signal communication cannot be guaranteed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
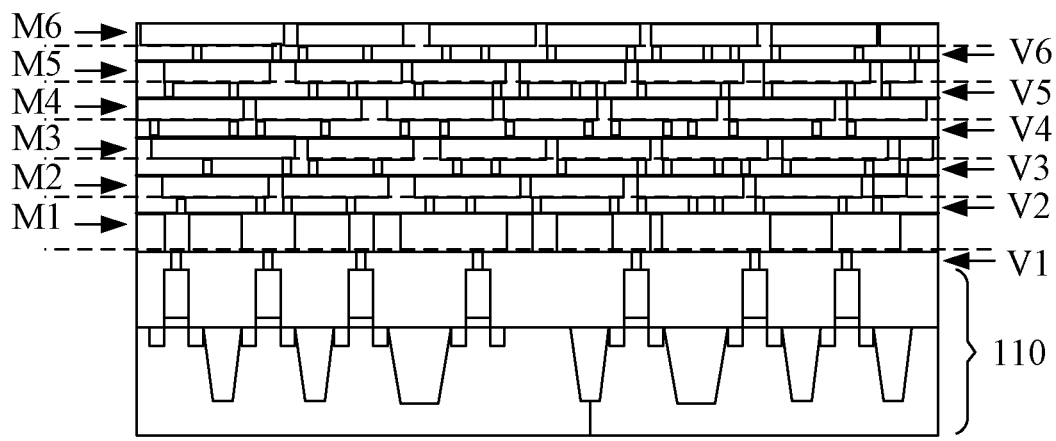
FIG. 1 is a schematic diagram of a semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

FIG. 1 is a schematic diagram of a semiconductor device 100 in accordance with various embodiments of the present disclosure. The semiconductor device 100 includes a device portion 110, metal layers M1-M6 and via layers V1-V6.

In some embodiments, the metal layers M1-M6 are formed on the device portion 110 and are electrically connected to the device portion 110. The metal layers M1-M6 include metal lines (not labeled) to connect different IC components in the device portion 110 together. The via layers V1-V6 connects different metal lines in different metal layers M1-M6.

For illustration in FIG. 1, the metal layers M1-M6 include six layers that are labeled as M1, M2, M3, M4, M5 and M6 respectively. In some embodiments, the metal layers M1-M6 are grouped into pairs of neighboring metal layers, e.g., M1/M2, M3/M4 and M5/M6.

Figure 2:
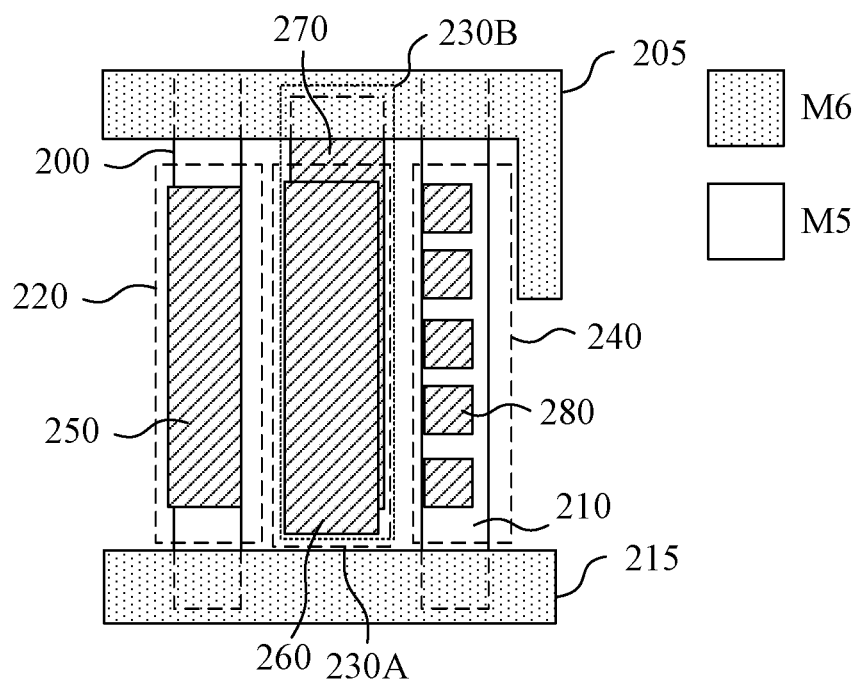
FIG. 2 is an exemplary diagram of a top view of the pair of neighboring metal layers in accordance with various embodiments of the present disclosure.

FIG. 2 is an exemplary diagram of a top view of the pair of neighboring metal layers M5 and M6 in accordance with various embodiments of the present disclosure.

For illustration in FIG. 2, a line 200 and a signal line 210 are presented in the metal layer M5. In some embodiments, the line 200 is either a power line or a ground line. Two signal lines 205 and 215 are presented in the metal layer M6.

In some embodiments, empty areas 220, 230A, 230B and 240 are the areas in each of the metal layers M5 and M6 that have no metal line passing through. Therefore, the empty area 220 is presented in metal layer M6 and is overlapped by the line 200 in metal layer M5. The empty area 230A enclosed by the dash line frame in FIG. 3B, is presented in metal layers M6. The empty area 230B enclosed by the dot line frame in FIG. 3B, is presented in metal layers M5. The empty area 230A and the empty area 230B are two overlapped empty areas. The empty area 240 is presented in metal layer M6 and is overlapped by the signal line 210 in metal layer M5.

A dummy conductive cell 250 is formed in the empty area 220 and overlaps the line 200. Two dummy conductive cells 260 and 270 are formed in the empty areas 230A and 230B in metal layers M6 and M5. In some embodiments, the empty area 230B in metal layer M5 extends longer than the empty area 230A in metal layer M6, and the dummy conductive cell 270 is formed larger than the dummy conductive cell 260. A group of dummy conductive cells 280 are formed in the empty area 240 in metal layer M6 and overlap the signal line 210.

In some embodiments, the area of each of the dummy conductive cells 280 is smaller and is separated to not fully cover the empty area 240. As a result, the group of dummy conductive cells 280 provides a density less than the density of the dummy conductive cells 250-270. Explained in a different way, the ratio between the total areas of the group of dummy conductive cells 280 and the empty area 240 is less than the ratio between the total areas of, for example, the dummy conductive cell 250 and the empty area 220.

In some embodiments, the material of the dummy conductive cells 250-280 includes metal. Effectively, each of the dummy conductive cells 250-280 forms a capacitor with either an overlapped metal line for transmitting power/signal or another overlapped dummy conductive cell in the neighboring metal layer. As a result, the dummy conductive cells 250-280 provide a decoupling effect to further provide noise immunity to the overlapped metal line such as the line 200 and the signal line 210.

Effectively, the dummy conductive cell 250 has a greater density and provides a greater decoupling effect to guarantee good noise immunity of the line 200 to ensure integral signal communication. The dummy conductive cells 260 and 270 not only provide a uniformity of the semiconductor device 100 illustrated in FIG. 1 when the overlapped empty areas 230A and 230B are presented in two neighboring layers M5 and M6, but also provide a greater decoupling effect to guarantee good noise immunity among the metal lines neighboring to the empty areas 230A and 230B. Moreover, the dummy conductive cell 280 having less density provides a lighter decoupling effect to provide noise immunity to the signal line 210 without interfering the signal transmission therein.

By forming the dummy conductive cells 250-280, the dummy conductive cells 250-280 provide a decoupling effect to guarantee good noise immunity of the metal lines in the metal layers M5 and M6. At the same time, the uniformity of the semiconductor device 100 is maintained after chemical-mechanical polishing (CMP) process. The process yield is thus enhanced. As a result, the capacitance in the metal layers M5 and M6 is increased to commit the chip power/ground integrity with an enhanced process yield. No additional area is needed to dispose additional capacitors.

In some embodiments, the dummy conductive cells are formed in other metal layers M1-M4 in FIG. 1 too. Various configurations of the dummy conductive cells and the metal lines in different metal layers M1-M4 are within the contemplated scope of the present disclosure.

In some embodiments, when there are metal layers in the semiconductor device 100 that are not paired with other metal layers, the dummy conductive cells of the larger density are formed in the empty areas in these metal layers.

The formation of dummy conductive cells is exemplarily illustrated below.

FIGS. 3A-3D are top views of the pair of neighboring metal layers M5 and M6 in different stages of the formation of the dummy conductive cells 250-280 in accordance with various embodiments of the present disclosure.

Figure 4:
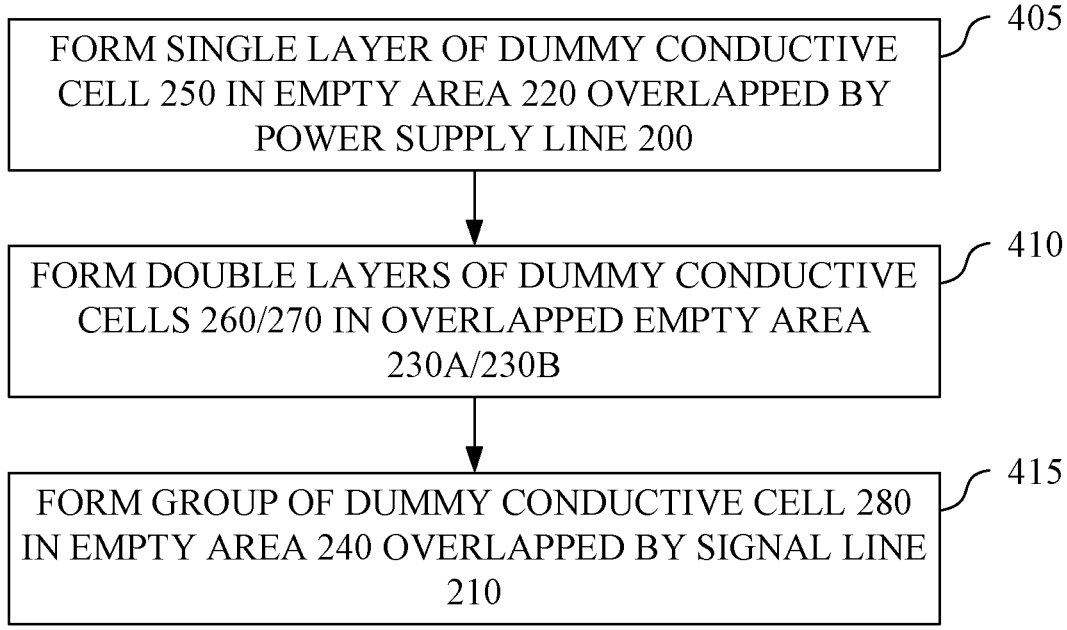
FIG. 4 is a flow chart of a method illustrating the process of forming the dummy conductive cells in the metal layers in FIG. 2, in accordance with various embodiments of the present disclosure.

FIG. 4 is a flow chart of a method 400 illustrating the process of forming the dummy conductive cells 250-280 in the metal layers M5 and M6 in FIG. 2, in accordance with various embodiments of the present disclosure.

For illustration, the formation of the dummy conductive cells 250-280 in FIG. 2 is described by the method 400 with reference to FIG. 3A-3D.

Figure 3A:
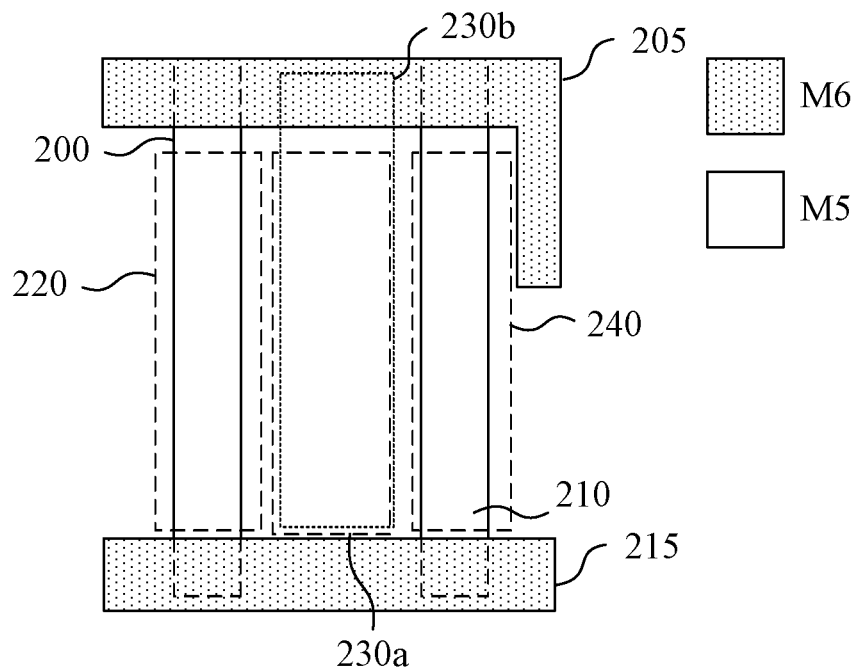
FIGS. 3A-3D are top views of the pair of neighboring metal layers in different stages of the formation of the dummy conductive cells in accordance with various embodiments of the present disclosure.
Figure 3B:
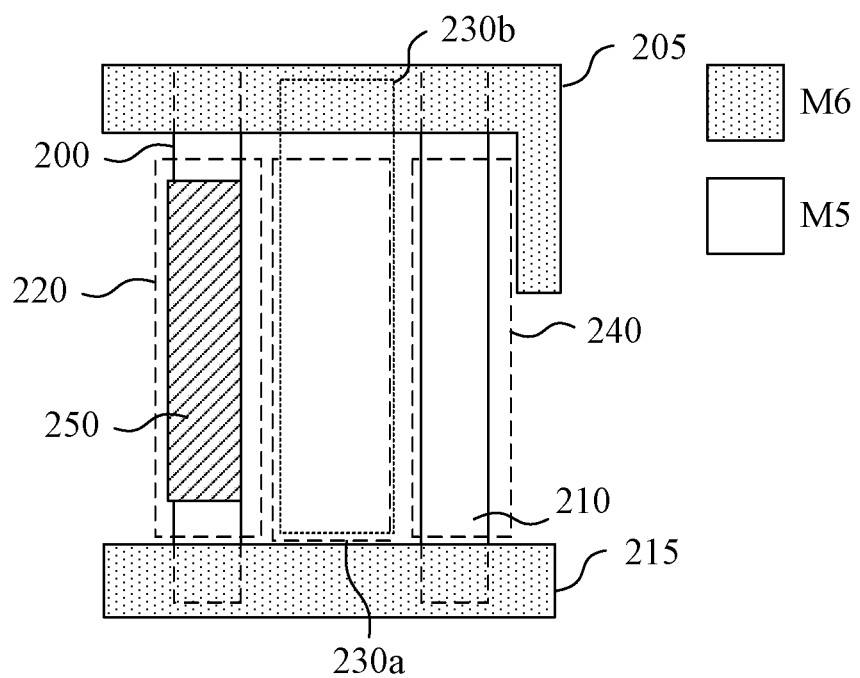

As shown in FIG. 3A, the metal layers M5 and M6 include empty areas 220, 230A, 230B and 240.

In operation 405, a single layer of the dummy conductive cell 250 is formed in the empty area 220, as illustrated in FIG. 3B, in which the overlap condition of the empty area 220 indicates that the empty area 220 is overlapped by the line 200 in the neighboring metal layer M5.

Figure 3C:
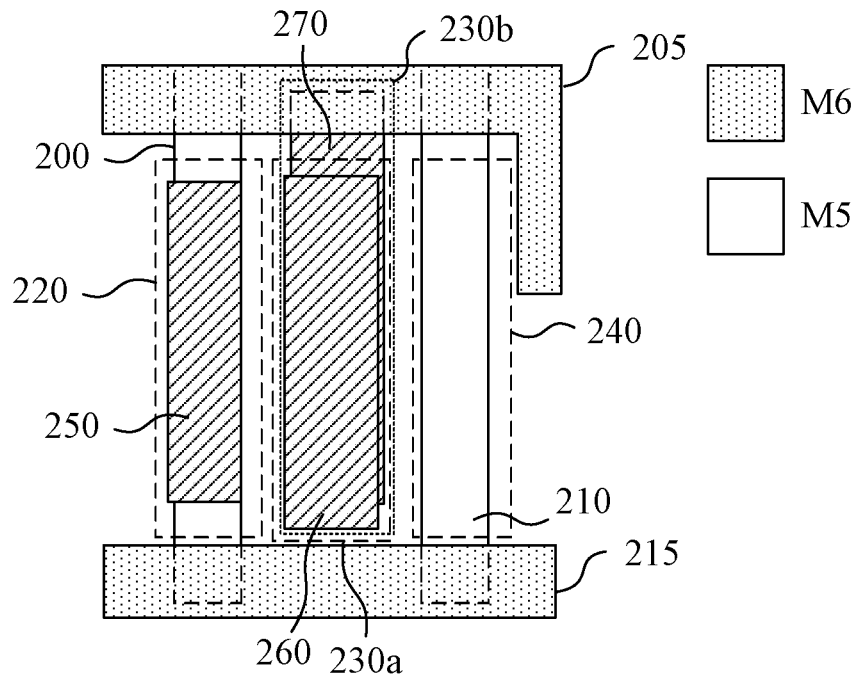

In operation 410, double layers of the dummy conductive cells 260 and 270 are formed in the two overlapped empty areas 230A and 230B respectively, as illustrated in FIG. 3C, in which the overlap conditions of the two empty areas 230A and 230B indicates that the empty areas 230A and 230B are two overlapped empty areas in two neighboring metal layers M5 and M6.

Figure 3D:
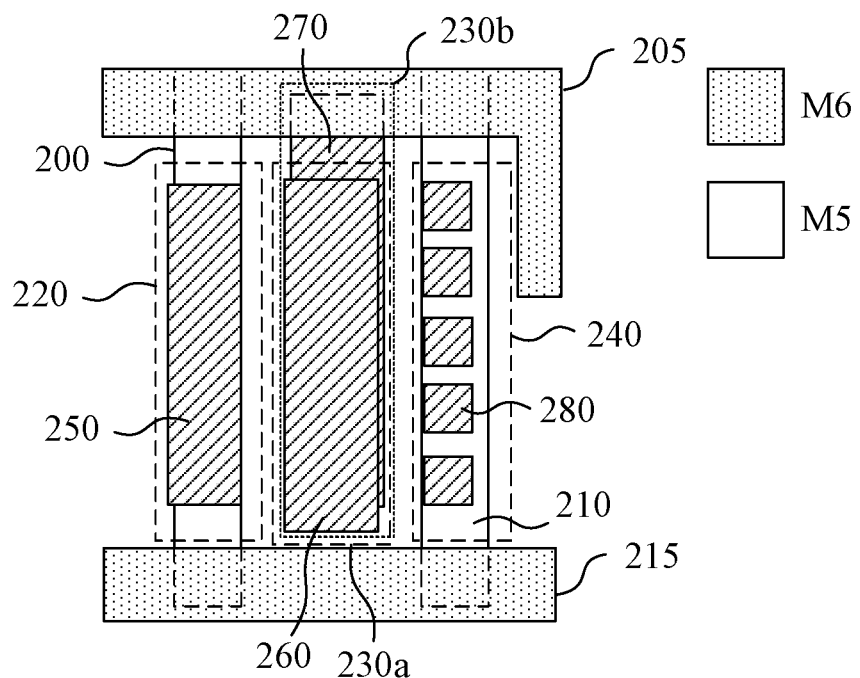

In operation 415, a group of independent dummy conductive cells 280 are formed in the empty area 240, as illustrated in FIG. 3D, in which the overlap conditions of the empty area 240 indicates that the empty area 240 is overlapped by the signal line 210 in the neighboring metal layer M5.

The configuration of metal layers M5 and M6 including the dummy conductive cells 250-280 is illustrated in FIG. 2.

In some embodiments, the dummy conductive cells in other pairs of neighboring metal layers such as M1/M2 and M3/M4 are formed by using the operations 405-415. Various configurations depend on the configurations of empty layers and metal lines in these pairs of neighboring metal layers.

Figure 5:
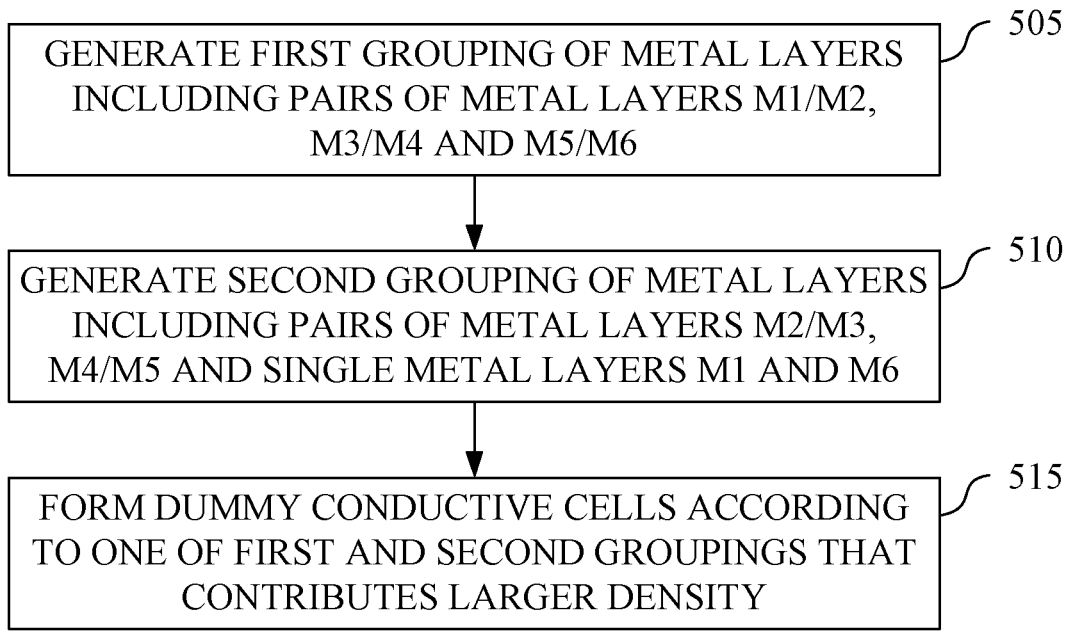
FIG. 5 is a flow chart of a method illustrating the process of forming the dummy conductive cells in the metal layers in FIG. 1, in accordance with various embodiments of the present disclosure.

FIG. 5 is a flow chart of a method 500 illustrating the process of forming the dummy conductive cells in the metal layers M1-M6 in FIG. 1, in accordance with some embodiments of the present disclosure.

In operation 505, a first grouping of the metal layers, that includes the pairs of metal layers M1/M2, M3/M4 and M5/M6, is generated.

In operation 510, a second grouping of the metal layers, that includes the pairs of metal layers M2/M3, M4/M5 and two single metal layers M1 and M6, is generated.

In operation 515, forming the dummy conductive cells according to one of the first grouping and the second grouping that has the overlap conditions contributing a larger density.

In some embodiments, the dummy conductive cells are formed by using the operations 405-415 illustrated in FIG. 4.

Based on the operations 505, 510 and 515, the empty areas in the metal layers M1-M6 of the semiconductor device 100 in different groups are evaluated. The dummy conductive cells are formed according to the evaluation result to accomplish the largest density to provide a better uniformity and noise immunity to the metal layers M1-M6.

Figure 6:
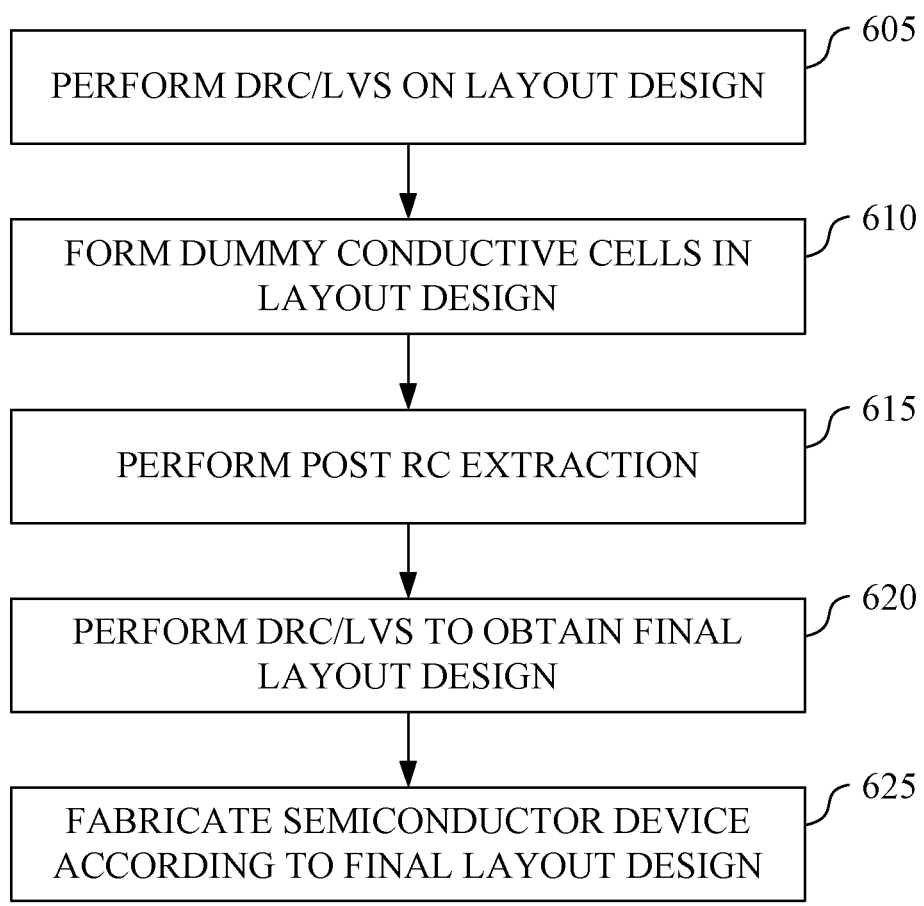
FIG. 6 is a flow chart of a method illustrating the process of forming the dummy conductive cells to the semiconductor device in FIG. 1, in accordance with various embodiments of the present disclosure.

FIG. 6 is a flow chart of a method 600 illustrating the process of forming the dummy conductive cells in the semiconductor device 100 in FIG. 1, in accordance with some embodiments of the present disclosure.

In operation 605, a verification process including the design rule check (DRC) and the layout versus schematic (LVS) is performed on a layout design of the semiconductor device 100. In some embodiments, the layout design of the semiconductor device 100 includes only the device portion 110 and the metal layers M1-M6. Further, the layout design of the semiconductor device 100 is formed by an auto place and route (APR) tool.

In operation 610, the dummy conductive cells in the metal layers M1-M4 are formed in the layout design of the semiconductor device 100 to generate a graphic data system (GDS) file. In some embodiments, the dummy conductive cells are formed by using the operations 305-315 illustrated in FIG. 3 and the operations 405, 410, and 415 illustrated in FIG. 4.

In some embodiments, after the generation of the GDS file, a Milky/LEF file is generated subsequently to allow the APR tool to read the file and perform the chip implantation flow to connect the dummy conductive cells. In some embodiments, pins are added on these dummy conductive cells such that the APR tool is able to identify the dummy conductive cells to perform the chip implantation flow.

In some embodiments, after the generation of the GDS file, the connection of the dummy conductive cells is performed manually.

In operation 615, a post RC (resistor and capacitor) extraction is performed on the layout design including the dummy conductive cells.

In operation 620, another verification process including the DRC and the LVS is performed again to obtain a final layout design of the semiconductor device 100.

In operation 625, the semiconductor device 100 is fabricated according to the final layout design.

Based on the aforementioned operations, the empty areas in the metal layers M1-M6 are analyzed during the design stage of the semiconductor device 100. The overlap conditions of the empty areas with the neighboring layers are thus determined. Subsequently, the dummy conductive cells with different densities are formed according to the overlap conditions during the fabrication process to provide the uniformity and the noise immunity to the metal layers M1-M6.

In some embodiment, a method that includes forming dummy conductive cells that provides different densities in empty areas in metal layers of a semiconductor device according to overlap conditions of the empty areas each arranged between a pair of neighboring metal layers of the metal layers. Forming the dummy conductive cells includes forming a group of dummy conductive cells in a single empty area of the empty areas when the single empty area in one pair of the neighboring metal layers is overlapped by a signal line in the same pair of the neighboring metal layers. When viewed in plan view, projection areas of the group of dummy conductive cells are vertically overlapped by a projection area of the signal line.

In some embodiment, forming the plurality of dummy conductive cells further includes forming two layers of dummy conductive cells in two overlapped empty areas, respectively, of the empty areas, when the two overlapped empty areas of the empty areas are presented in one pair of the neighboring metal layers of the metal layers.

In some embodiment, the group of dummy conductive cells is formed with a density less than that of the two layers of dummy conductive cells.

In some embodiment, forming the plurality of dummy conductive cells further includes forming a single layer of dummy conductive cell, in one of the metal layers, the single layer of dummy conductive cell vertically overlapping a power line or a ground line.

In some embodiment, the group of dummy conductive cells is formed with a density less than that of the single layer of dummy conductive cell.

In some embodiment, forming the plurality of dummy conductive cells further includes forming a single layer of dummy conductive cell in a single empty area to form at least one capacitor between the single layer of dummy conductive cell and one of a power line and a ground line.

In some embodiment, material of at least one of the plurality of dummy conductive cells comprises metal.

Also disclosed is a semiconductor device. The semiconductor device includes a first signal line and a group of first dummy conductive cells. The first signal line is formed in one of a pair of metal layers. The pair of metal layers include a first empty area. The group of first dummy conductive cells are formed in the first empty area. The group of first dummy conductive cells provide a distribution density. The group of first dummy conductive cells fully overlaps the first signal line vertically.

In some embodiment, an area of each first dummy conductive cell in the group of first dummy conductive cells is smaller than the first empty area in plan view.

In some embodiment, the semiconductor device further includes a second signal line and a second dummy conductive cell. The second signal line is formed in the pair of metal layers. The pair of metal layers further include a second empty area. The second dummy conductive cell is formed in the second empty area. The second dummy conductive cell fully overlaps the second signal line vertically.

In some embodiment, the distribution density of the group of first dummy conductive cells is less than that of the second dummy conductive cell.

In some embodiment, the semiconductor device further includes a pair of third dummy conductive cells. The pair of third dummy conductive cells are formed in a third empty area which is included in the pair of metal layers. One of the pair of third dummy conductive cells is overlapped by the other one of the pair of third dummy conductive cells vertically.

In some embodiment, one of the pair of third dummy conducive cells is larger than the other one of the pair of third dummy conducive cells.

In some embodiment, the distribution density of the group of first dummy conductive cells is less than that of the pair of third dummy conductive cells.

Also disclosed is a semiconductor device. The semiconductor device includes a first dummy conductive cell and a group of second dummy conductive cells. The first dummy conductive cell is formed in a first area between a pair of metal layers without metal line passing therethrough. The group of second dummy conductive cells are formed in a second area between the pair of metal layers without metal line passing therethrough. The group of second dummy conductive cells are separated from each other. The first dummy conductive cell vertically overlaps a first signal line formed in the pair of metal layers, and the group of second dummy conductive cells vertically overlap a second signal line formed in the pair of metal layers.

In some embodiment, a ratio of a total area of the group of second dummy conductive cells to the second area is less than a ratio of an area of the first dummy conductive cell to the first area.

In some embodiment, the semiconductor device further includes a third dummy conductive cell and a fourth dummy conducive cell. The third dummy conductive cell is formed in third area between the pair of metal layers without metal line passing therethrough. The fourth dummy conductive cell is formed in fourth area between the pair of metal layers without metal line passing therethrough. The third dummy conductive cell vertically overlaps the fourth dummy conducive cell.

In some embodiment, the third dummy conducive cell and the fourth dummy conductive cell have areas that are different from each other.

In some embodiment, a ratio of a total area of the group of second dummy conductive cells to the second area is less than a ratio of an area of the third dummy conductive cell to the third area, and is less than a ratio of an area of the fourth dummy conductive cell to the fourth area.

In some embodiment, the semiconductor device further includes a device portion which includes a plurality of integrated circuit components. The first dummy conductive cell and the group of second dummy conductive cells are formed on the device portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a plurality of dummy conductive cells that provides different densities in empty areas in a plurality of metal layers of a semiconductor device according to overlap conditions of the empty areas each arranged between a pair of neighboring metal layers of the plurality of metal layers,
    wherein forming the plurality of dummy conductive cells comprises:
        forming a group of dummy conductive cells in a single empty area of the empty areas when the single empty area in one pair of the neighboring metal layers is overlapped by a signal line in the same pair of the neighboring metal layers, and
    wherein when viewed in plan view, projection areas of the group of dummy conductive cells are vertically overlapped by a projection area of the signal line.

2. The method of claim 1, wherein forming the plurality of dummy conductive cells further comprises:
    forming two layers of dummy conductive cells in two overlapped empty areas, respectively, of the empty areas, when the two overlapped empty areas of the empty areas are presented in one pair of the neighboring metal layers of the metal layers.

3. The method of claim 2, wherein the group of dummy conductive cells is formed with a density less than that of the two layers of dummy conductive cells.

4. The method of claim 1, wherein forming the plurality of dummy conductive cells further comprises:
    forming a single layer of dummy conductive cell, in one of the metal layers, the single layer of dummy conductive cell vertically overlapping a power line or a ground line.

5. The method of claim 4, wherein the group of dummy conductive cells is formed with a density less than that of the single layer of dummy conductive cell.

6. The method of claim 1, forming the plurality of dummy conductive cells further comprises:
    forming a single layer of dummy conductive cell in a single empty area to form at least one capacitor between the single layer of dummy conductive cell and one of a power line and a ground line.

7. The method of claim 1, wherein material of at least one of the plurality of dummy conductive cells comprises metal.

8. A semiconductor device, comprising:
    a first signal line formed in one of a pair of metal layers, wherein the pair of metal layers comprise a first empty area; and
    a group of first dummy conductive cells formed in the first empty area, wherein the group of first dummy conductive cells provide a distribution density,
    wherein the group of first dummy conductive cells fully overlaps the first signal line vertically.

9. The semiconductor device of claim 8, wherein
    an area of each first dummy conductive cell in the group of first dummy conductive cells is smaller than the first empty area in plan view.

10. The semiconductor device of claim 8, further comprising:
    a second signal line formed in the pair of metal layers, wherein the pair of metal layers further comprise a second empty area; and
    a second dummy conductive cell formed in the second empty area,
    wherein the second dummy conductive cell fully overlaps the second signal line vertically.

11. The semiconductor device of claim 10, wherein the distribution density of the group of first dummy conductive cells is less than that of the second dummy conductive cell.

12. The semiconductor device of claim 8, further comprising:
    a pair of third dummy conductive cells formed in a third empty area which is comprised by the pair of metal layers,
    wherein one of the pair of third dummy conductive cells is overlapped by the other one of the pair of third dummy conductive cells vertically.

13. The semiconductor device of claim 12, wherein one of the pair of third dummy conducive cells is larger than the other one of the pair of third dummy conducive cells.

14. The semiconductor device of claim 12, wherein the distribution density of the group of first dummy conductive cells is less than that of the pair of third dummy conductive cells.

15. A semiconductor device, comprising:
    a first dummy conductive cell formed in a first area between a pair of metal layers without metal line passing therethrough; and
    a group of second dummy conductive cells formed in a second area between the pair of metal layers without metal line passing therethrough, wherein the group of second dummy conductive cells are separated from each other,
    wherein the first dummy conductive cell vertically overlaps a first signal line formed in the pair of metal layers, and the group of second dummy conductive cells vertically overlap a second signal line formed in the pair of metal layers.

16. The semiconductor device of claim 15, wherein a ratio of a total area of the group of second dummy conductive cells to the second area is less than a ratio of an area of the first dummy conductive cell to the first area.

17. The semiconductor device of claim 15, further comprising:
    a third dummy conductive cell formed in third area between the pair of metal layers without metal line passing therethrough; and a fourth dummy conductive cell formed in fourth area between the pair of metal layers without metal line passing therethrough, wherein the third dummy conductive cell vertically overlaps the fourth dummy conducive cell.

18. The semiconductor device of claim 17, wherein the third dummy conducive cell and the fourth dummy conductive cell have areas that are different from each other.

19. The semiconductor device of claim 17, wherein a ratio of a total area of the group of second dummy conductive cells to the second area is less than a ratio of an area of the third dummy conductive cell to the third area, and is less than a ratio of an area of the fourth dummy conductive cell to the fourth area.

20. The semiconductor device of claim 15, further comprising:

a device portion comprising a plurality of integrated circuit components, wherein the first dummy conductive cell and the group of second dummy conductive cells are formed on the device portion.

* * * * *